United States Patent
Lee

(10) Patent No.: US 7,968,408 B2
(45) Date of Patent: Jun. 28, 2011

(54) MIM CAPACITOR AND METHOD OF FABRICATING THE SAME

(75) Inventor: Han-Choon Lee, Gangdong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 293 days.

(21) Appl. No.: 12/203,971

(22) Filed: Sep. 4, 2008

(65) Prior Publication Data

US 2009/0065897 A1 Mar. 12, 2009

(30) Foreign Application Priority Data

Sep. 7, 2007 (KR) .................. 10-2007-0091175

(51) Int. Cl.
*H01L 21/336* (2006.01)
*H01L 29/94* (2006.01)
(52) U.S. Cl. ........................................ 438/266; 257/333
(58) Field of Classification Search .................. 257/296, 257/301, 306, 308, 532, 640, 649, 333; 438/266, 438/393
See application file for complete search history.

(56) References Cited

U.S. PATENT DOCUMENTS

| | | | |
|---|---|---|---|
| 5,629,043 A * | 5/1997 | Inaba et al. | 427/79 |
| 2001/0016394 A1 | 8/2001 | Koyanagi et al. | |
| 2003/0008467 A1 * | 1/2003 | Kai et al. | 438/393 |
| 2005/0062130 A1 | 3/2005 | Anthony Ciancio et al. | |

* cited by examiner

*Primary Examiner* — Calvin Lee
(74) *Attorney, Agent, or Firm* — Sherr & Vaughn, PLLC

(57) ABSTRACT

A M-I-M capacitor semiconductor device capable of enhancing the reliability and capacitance of a capacitor and maximizing the integration density of the device, and a method of fabricating the same are disclosed. The semiconductor device includes a semiconductor substrate, a capacitor lower metal layer formed over the semiconductor substrate, a SiN capacitor dielectric layer having a thickness of approximately 30 nm or less formed over the capacitor lower metal layer, and a capacitor upper metal layer formed over a portion of the capacitor dielectric layer and overlapping with the capacitor lower metal layer.

19 Claims, 7 Drawing Sheets

MIM CAPACITOR AND METHOD OF FABRICATING THE SAME

The present application claims priority under 35 U.S.C. 119 to Korean Patent Application No. 10-2007-0091175 (filed on Sep. 7, 2007), which is hereby incorporated by reference in its entirety.

BACKGROUND

In the fabrication of complex chips in which memory parts and digital/analog logic parts are fabricated simultaneously, it is very important to restrict the increase of additional processes while achieving desired characteristics of all necessary processes.

Currently, efforts to reduce manufacturing costs and to reduce consumption of electric energy via higher speed and higher integration of semiconductor devices are ongoing. In one line of effort, a System-On-Chip (SOC) device in which low-voltage device and high-voltage devices are included together in a single chip has been developed.

In an SOC device, although the characteristics of digital devices are important, the characteristics of analog devices, such as resistors, inductance coils, and capacitors, are particularly important. Methods of fabricating devices with higher levels of device integration by improving analog devices, particularly capacitors, are needed.

Figure 1:
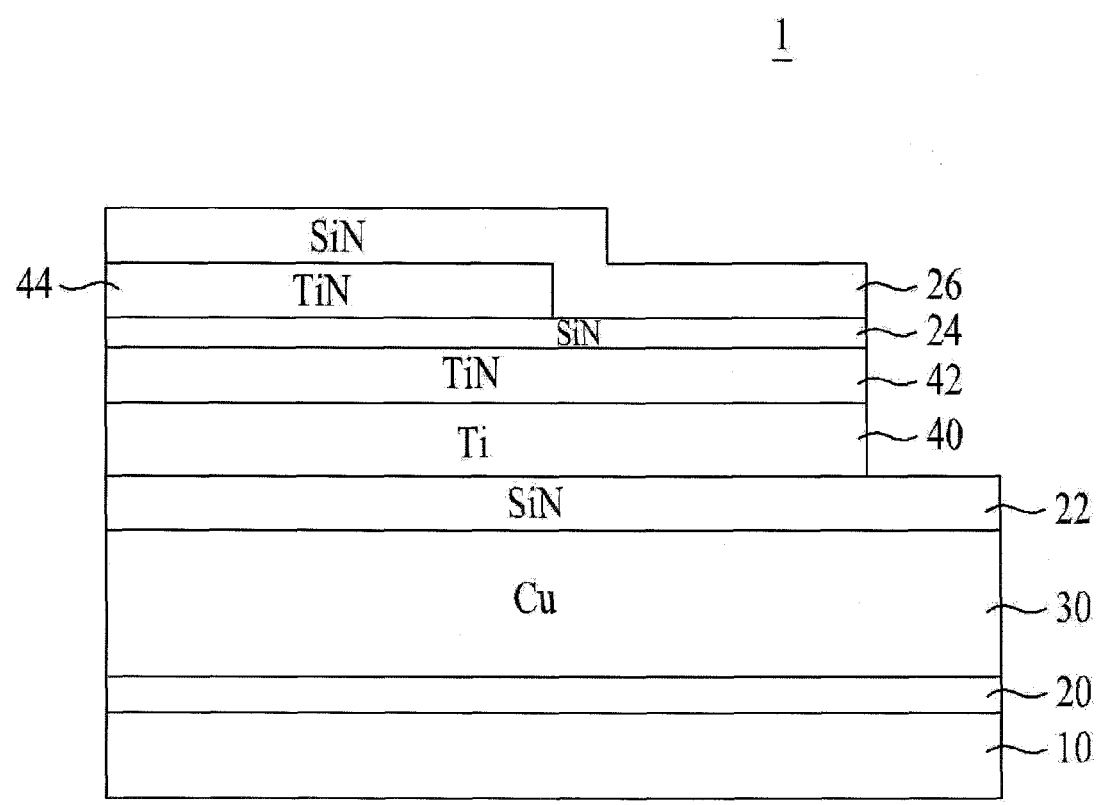

FIG. 1 is a sectional view illustrating the configuration of a related MIM capacitor. Referring to FIG. 1, the related MIM capacitor 1 may include a silicon (Si) semiconductor substrate 10, a first silicon insulating layer 20 and a lower metal layer 30 sequentially formed over the semiconductor substrate 10. A second silicon nitride (SiN) insulating layer 22 may be formed over the lower metal layer 30. Capacitor lower metal layers 40 and 42 may be sequentially formed over a portion of the second SiN insulating layer 22. A capacitor dielectric layer 24 may be formed over the capacitor lower metal layers 40 and 42. A capacitor upper metal layer 44 may be formed to overlap with the capacitor lower metal layers 40 and 42 with the capacitor dielectric layer 24 interposed therebetween. An insulating layer 26 may be formed over the entire surface of the capacitor dielectric layer 24 and the capacitor upper metal layer 44. Illustration of bonding metal layers, contact plugs, connection wirings, etc. formed on the metal layers of the MIM capacitor 1 may be omitted.

The MIM capacitor 1 having the configuration described above must include a capacitor dielectric layer 24 with a high dielectric constant to increase the level of integration of the device. Recently, an enhanced capacitor dielectric layer 24 with a higher dielectric constant has been required to provide capacitance densities in the range of about 2 fF/cm$^2$ to 4 fF/cm$^2$, and in extreme cases, higher than 4 fF/cm$^2$.

To obtain a capacitance density of 4 fF/cm$^2$ or more when the capacitor dielectric layer 24 is made of the most widely commercialized Plasma Enhanced Silicon Nitride (PE-SiN), the capacitor dielectric layer 24 must have a thickness of 30 nm or less.

However, a PE-SiN capacitor dielectric layer with a thickness of 30 nm or less results in abnormal deposition of SiN and deterioration in the reliability of the device. To overcome this problem, attempts may be made to form the dielectric layer using $Al_2O_3$ or HfO based materials instead of SiN. However, these materials require implementation of an Atomic Layer Deposition (ALD) process, with the inevitable generation of particles is due to inherent process characteristics.

Moreover, when the ALD process is performed using $Al_2O3$ or HfO based materials, the overall fabrication method is complicated. A process for removing particles generated during the ALD process must be added. As a result, the complicated overall fabrication method exhibits low fabrication efficiency and disadvantageously increases the costs of the resulting semiconductor devices. To solve the above-described problems, a new configuration for a capacitor dielectric layer capable of improving fabrication efficiency and a method of fabricating the same are necessary.

SUMMARY

Embodiments relate to a semiconductor device and a method of fabricating the same, and more particularly, to a Metal-Insulator-Metal (MIN) capacitor semiconductor device capable of enhancing the reliability and capacitance of a capacitor and maximizing the integration density of the device, and a method of fabricating the same. Embodiments relate to an MIM capacitor semiconductor device and a method of fabricating the same, in which a capacitor dielectric layer may have a thickness of 30 nm or less, thereby enhancing a capacitance of an MIM capacitor and maximizing the integration density of the semiconductor device while preventing current leakage from the semiconductor device.

Embodiments relate to a semiconductor device which includes a semiconductor substrate, a capacitor lower metal layer formed over the semiconductor substrate, a SiN capacitor dielectric layer having a thickness of approximately 30 nm or less formed over the capacitor lower metal layer, and a capacitor upper metal layer formed over a portion of the capacitor dielectric layer and overlapping with the capacitor lower metal layer.

The capacitor dielectric layer may be formed via a remote plasma reaction between a SiN layer surface and a mixture of $NF_3$ or $NH_3$ gas and argon (Ar) gas. The semiconductor substrate may include a Fluorine doped Silicate Glass (FSG) layer, a first $SiH_4$ oxide insulating layer, and a SiN layer. Each of the capacitor lower metal layer and the capacitor upper metal layer may be formed of a Ti or Tin layer, or is formed of Ti and TiN layers. The Ti layer may have a thickness of 1,000 Å to 1,600 Å, and the TiN layer may have a thickness of 200 Å to 800 Å.

Embodiments relate to a method of fabricating a semiconductor device which includes: forming a capacitor lower metal layer over a semiconductor substrate including a plurality of layers, forming a SiN layer over the capacitor lower metal layer, reacting a surface of the SiN layer with a mixture of Ar gas and at least one of $NF_3$ and $NH_3$ gas via a remote plasma process to form a capacitor dielectric layer having a thickness of approximately 30 nm or less, and forming a capacitor upper metal layer over the capacitor dielectric layer.

The surface of the SiN layer may be subjected to the remote plasma process using a mixture of $NF_3$ or $NH_3$ gas at approximately 1,000 sccm to 3,000 sccm and Ar gas at approximately 500 sccm to 3,000 sccm at a pressure of approximately 4 Torr to 30 Torr and power of approximately 100 W to 400 W.

DRAWINGS

FIG. 1 is a sectional view illustrating the configuration of a related MIM capacitor.

Figure 2:
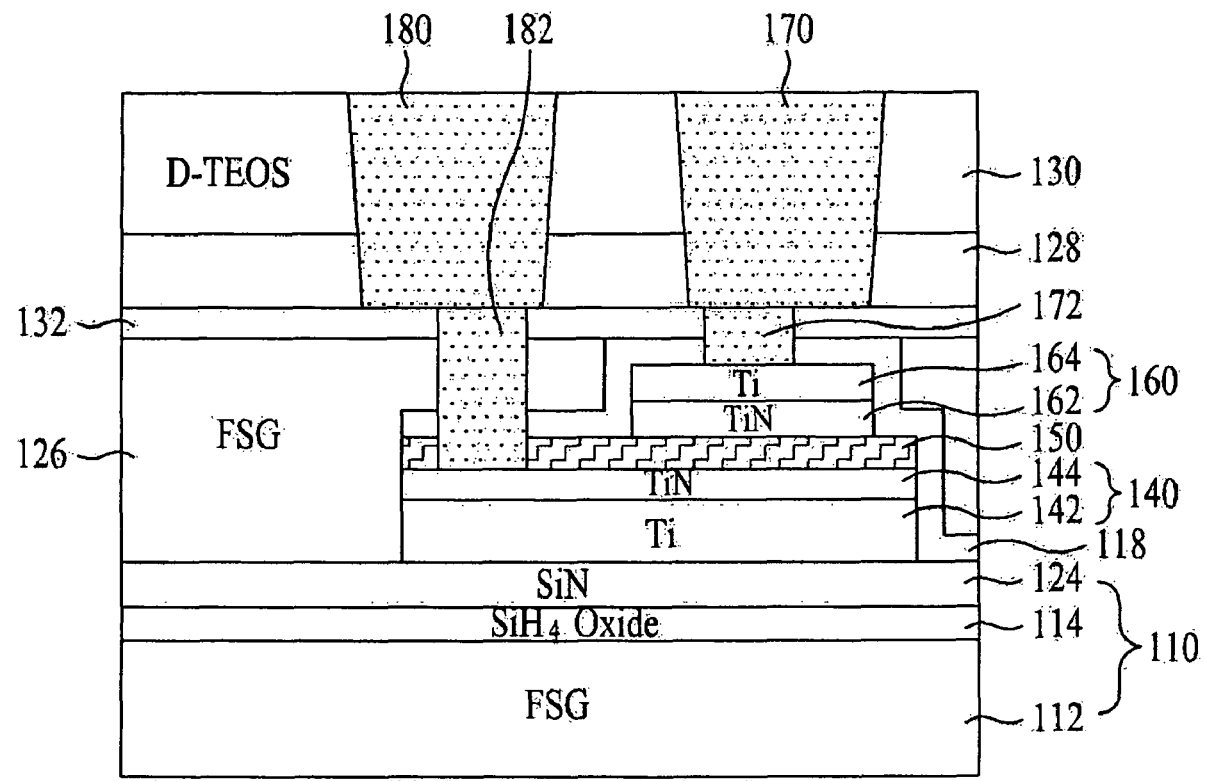

Example FIG. 2 is a sectional view illustrating the configuration of an MIM capacitor semiconductor device according to embodiments.

Example FIGS. 3A to 3H are process sectional views illustrating a method of fabricating an MIM capacitor semiconductor device according to embodiments.

DESCRIPTION

Hereinafter, a semiconductor device and a method of fabricating the same according to embodiments will be described with reference to the accompanying drawings. Example FIG. 2 is a sectional view illustrating the configuration of a MIM capacitor semiconductor device according to embodiments. In example FIG. 2, of the entire MIM capacitor semiconductor device, only a capacitor region associated with embodiments is illustrated. The remaining regions may have the same configuration as a related MIM capacitor semiconductor device and thus, illustration thereof will be omitted.

Referring to example FIG. 2, the MIM capacitor semiconductor device 100 according to embodiments includes a semiconductor substrate 110 including a Fluorine-doped Silicate Glass (FSG) layer 112. A first $SiH_4$ Oxide insulating layer 114, and a SiN layer 124 may be sequentially formed over a silicon wafer. A capacitor lower metal layer 140 including a plurality of metal layers 142 and 144 may be formed over the semiconductor substrate 110. A thin capacitor dielectric layer 150 may be formed over the capacitor lower metal layer 140. A capacitor upper metal layer 160 including a plurality of metal layers 162 and 164 may be formed over a partial region of the capacitor dielectric layer 150 so as to overlap with the capacitor lower metal layer 140. A second $SiH_4$ Oxide insulating layer 118 may be formed to cover a MIM capacitor region including the capacitor lower metal layer 140, the capacitor dielectric layer 150, and the capacitor upper metal layer 160. An FSG layer 126, a third Dual-TetraEthyl Ortho-Silicate (D-TEOS) insulating layer 132, a SiN layer 128, and a fourth D-TEOS insulating layer 130 may be sequentially formed over the entire surface of the semiconductor substrate 110.

The MIM capacitor semiconductor device 100 may further include first and second bonding metal layers 170 and 180 which may be formed of conductive metals and penetrate through the fourth insulating layer 130 and the SiN layer 128 over the MIM capacitor region. A first contact layer 172 which may be formed of conductive metal such as copper (Cu) may penetrate through the second and third insulating layers 118 and 132 so as to electrically connect the first bonding metal layer 170 and the capacitor upper metal layer 160 to each other. A second contact layer 182 which may be formed of conductive metal such as Cu may penetrate through the second and third insulating layers 118 and 132 and the capacitor dielectric layer 150 so as to electrically connect the second bonding metal layer 180 and the capacitor lower metal layer 140 to each other. The capacitor lower metal layer 140 and the capacitor upper metal layer 160 may include first metal layers 142 and 164 made of titanium (Ti), and second metal layers 144 and 162 made of titanium nitride (TiN), respectively.

Although the description above teaches an example with the upper and lower capacitor metal layers 140 and 160 including the plurality of metal layers formed of Ti and TiN, at least one of the upper and lower capacitor metal layers 140 and 160 may include only a single metal layer formed of Ti or TiN, rather than the plurality of layers.

The MIM capacitor semiconductor device 100 according to embodiments has a SiN capacitor dielectric layer 150 which may be formed to a thickness of 30 nm or less, thereby achieving an enhanced capacitance density in the MIM capacitor in a range of about 2 fF/cm$^2$ to 4 fF/cm$^2$ or more.

In addition, embodiments have a reduced physical size (i.e. area) of the capacitor, and consequently, an higher density of integration of the device. This feature can be understood with reference to the following Equation 1.

$$C = \frac{\varepsilon_o \varepsilon_c A}{t} \qquad \text{Equation 1}$$

Here, "C" represents a capacitance of the capacitor, "$\varepsilon_o$" represents vacuum permittivity, "$\varepsilon_c$" represents a dielectric constant of the dielectric layer, "A" represents an area of the dielectric layer, and "t" represents the thickness of the dielectric layer. As shown in FIG. 2 and Equation 1, the capacitance of the capacitor varies according to the thickness of the capacitor dielectric layer 150 and the area of the capacitor metal layers 140 and 160.

Explaining in more detail, to enhance a capacitance of the capacitor, it is necessary to reduce a thickness of the capacitor dielectric layer 150, or to increase an area of the capacitor metal layers 140 and 160. Although both methods can enhance a capacitance of the capacitor, increasing an area of the capacitor metal layers 140 and 160 results in an increased area of the overall semiconductor device, making it impossible to improve the integration density of the device. Therefore, in the MIM capacitor semiconductor device 100 according to embodiments, it is desirable that a capacitance of the MIM capacitor be enhanced by minimizing a thickness of the capacitor dielectric layer 150. With this configuration, it may be possible to enhance the capacitance of the capacitor while improving the integration density of the semiconductor device.

However, when attempting to form a MIM capacitor dielectric layer 150 having a thickness of 30 nm or less, as described above with relation to the problems of the related art, the capacitor dielectric layer 150 may exhibit a lattice breakdown phenomenon due to problems in fabrication processes, resulting in current leakage. The current leakage disadvantageously degrades the characteristics of the semiconductor device. In addition, when the capacitor dielectric layer 150 is formed of $Al_2O_3$ or HfO based materials, an ALD process must be performed, complicating the overall fabrication process and degrading fabrication efficiency.

The MIM capacitor semiconductor device 100 according to embodiments may have a capacitor dielectric layer 150 made of SiN and may have a thickness of 30 nm or less. To achieve these features, in embodiments, the SiN capacitor dielectric layer 150 may be subjected to a plasma reaction using a mixture of $NF_3$ or $NH_3$ gas and argon (Ar) gas.

In the plasma reaction, the SiN capacitor dielectric layer 150 may be subjected to a remote plasma process such that only N+ of the mixture of $NF_3$ or $NH_3$ gas and Ar gas reacts with a surface of the SiN layer. Thereby, the SiN capacitor dielectric layer 150 can be formed to a thickness of 30 nm or less. The SiN capacitor dielectric layer 150 is stable without a risk of lattice breakdown. As compared to a general plasma process performed at a close range, the remote plasma process is performed at a remote range in an automated manner. Accordingly, a process using toxic gases can be performed remotely, achieving stability in operation.

In embodiments, the implementation of the remote plasma process may be exemplified as follows. To form the SiN capacitor dielectric layer 150 described above, $NF_3$ or $NH_3$ gas at about 1,000 sccm to 3,000 sccm may be used. A process pressure may be in a range of approximately 4 Torr to 30 Torr. Together with the $NF_3$ or $NH_3$ gas, Ar gas at 500 sccm to 3,000 sccm may be used. Here, "sccm" is an abbreviated form of Standard Cubic Centimeter per Minute. RF power of 100 W to 400 W may be used.

It can be appreciated that the MIM capacitor semiconductor device 100 having the configuration described above according to embodiments can enhance a capacitance of the capacitor and improve a degree of integration of the device. In addition, the MIM capacitor semiconductor device 100 exhibits excellent leakage voltage characteristics as well as the above-described advantages, achieving safety in the device.

Example FIGS. 3A to 3H are process sectional views illustrating a method of fabricating an MIM capacitor semiconductor device according to embodiments, which will be described below. As shown in example FIG. 3A, the FSG layer 112, the first $SiH_4$ Oxide insulating layer 114, and the SiN layer 124 may be sequentially formed over the semiconductor silicon wafer, to form the semiconductor substrate 110.

Here, the three layers 112, 114, and 124 are FSG, $SiH_4$ Oxide, and SiN layers prepared by fluoridating, oxidizing, and nitrifying silicon (Si), respectively. Next, as shown in example FIG. 3B, the Ti layer 142 and the TiN layer 144 may be sequentially formed over a partial region of the semiconductor substrate 110, to form the capacitor lower metal layer 140. The Ti layer 142 may be formed to a thickness of approximately 1,000 Å to 1,600 Å, and the TiN layer 144 is formed to a thickness of approximately 200 Å to 800 Å.

Next, the SiN capacitor dielectric layer 150 may be formed over the capacitor lower metal layer 140. Here, the capacitor dielectric layer 150 may be formed by depositing a SiN layer to a thickness of 30 nm or less and subsequently, reacting the SiN layer with a mixture of $NF_3$ or $NH_3$ gas 154 and Ar gas via a remote plasma process using a remote plasma device 152. When the thin SiN layer with a thickness of 30 nm or less is exposed to the mixture of $NF_3$ or $NH_3$ gas 154 and Ar gas via the remote plasma process, N+ of the mixture reacts with a surface of the SiN layer without plasma damage, whereby the SiN capacitor dielectric layer 150 can be stably formed without a lattice breakdown phenomenon of the SiN layer.

Embodiments exemplifying conditions of the remote plasma process are as follows. In the formation of the SiN capacitor dielectric layer 150, $NF_3$ or $NH_3$ gas at 1,000 sccm to 3,000 sccm may be used. A process pressure may be in a range of 4 Torr to 30 Torr. Together with the $NF_3$ or $NH_3$ gas, Ar gas at 500 sccm to 3,000 sccm may be used. RF power of 100 W to 400 W may be used.

Figure 3A:
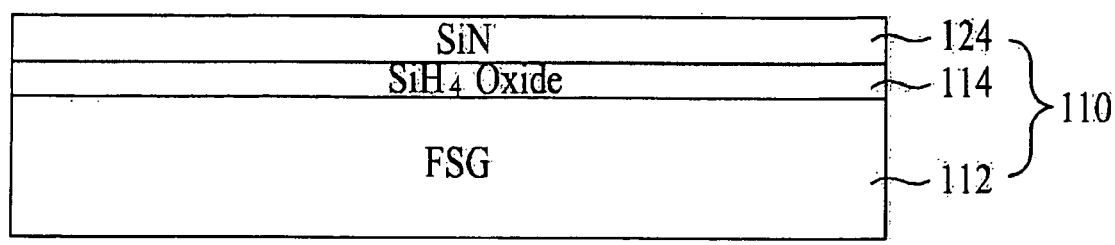
Figure 3B:
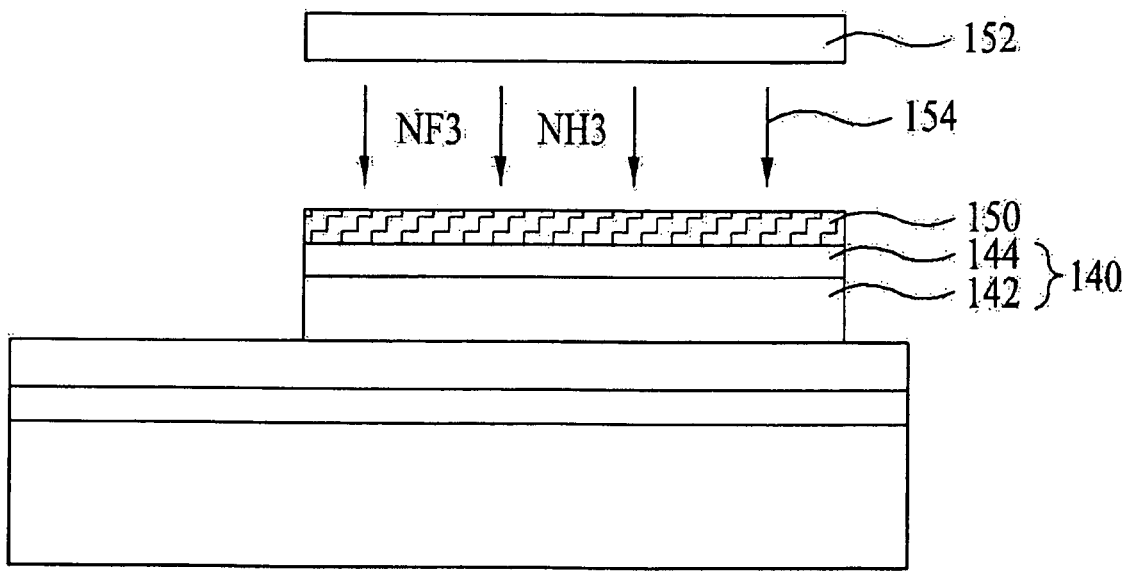
Figure 3C:
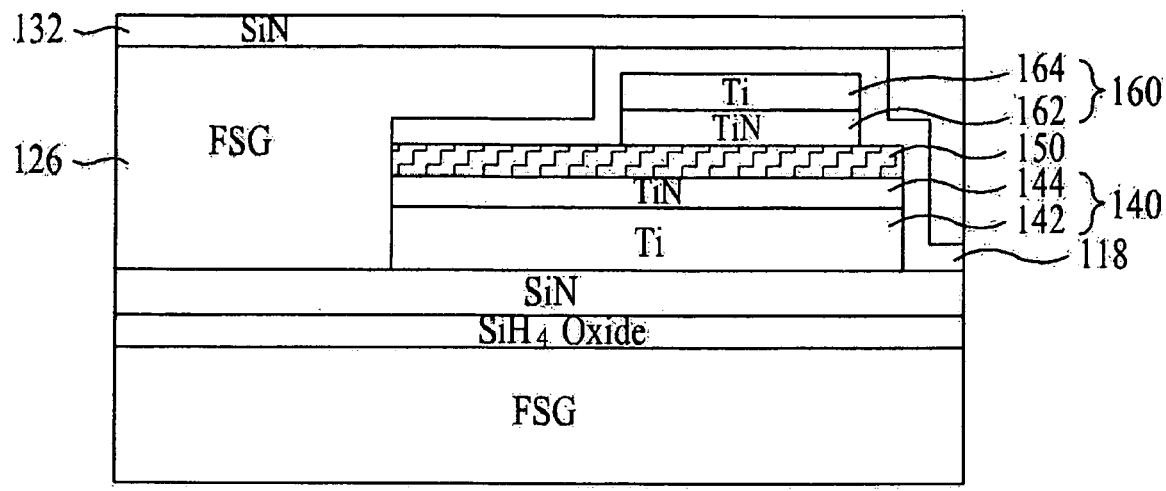

Thereafter, as shown in example FIG. 3C, the TiN layer 162 and the Ti layer 164 may be sequentially formed over a partial region of the capacitor dielectric layer 150, to form the capacitor upper metal layer 160. The Ti layer 164 may be formed to a thickness of 1,000 Å to 1,600 Å, and the TiN layer 162 is formed to a thickness of 200 Å to 800 Å.

Next, the second $SiH_4$ Oxide insulating layer 118 may be formed to cover the MIM capacitor region 140, 150, and 160. The FSG layer 126 and the third D-TEOS insulating layer 132 may be sequentially formed over the semiconductor substrate 110.

Figure 3D:
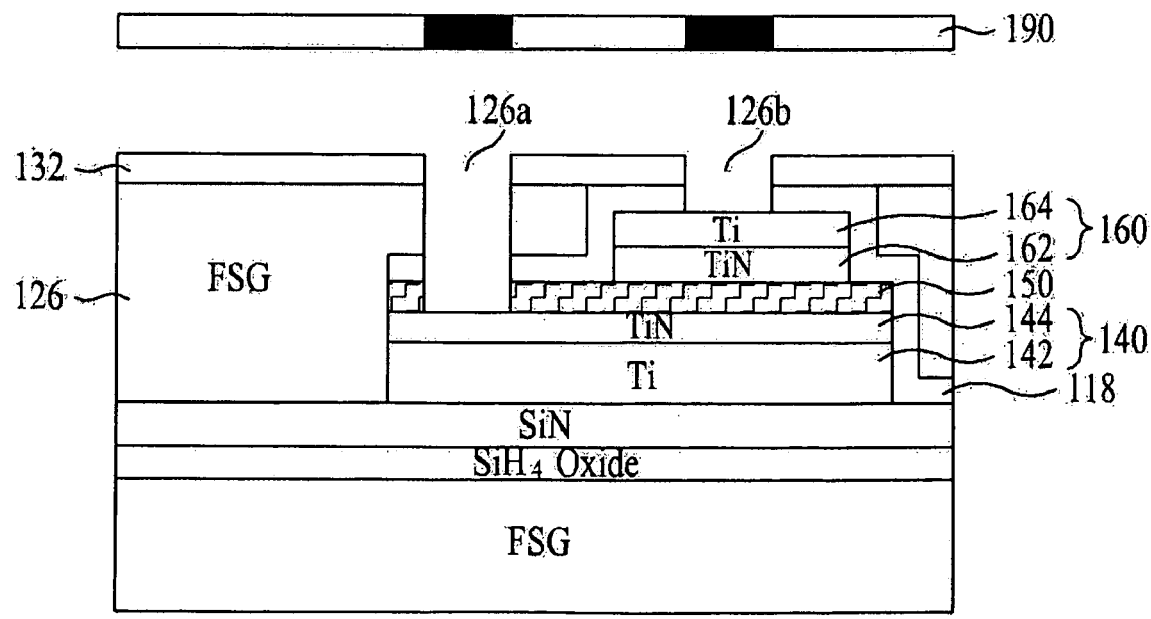
Figure 3E:
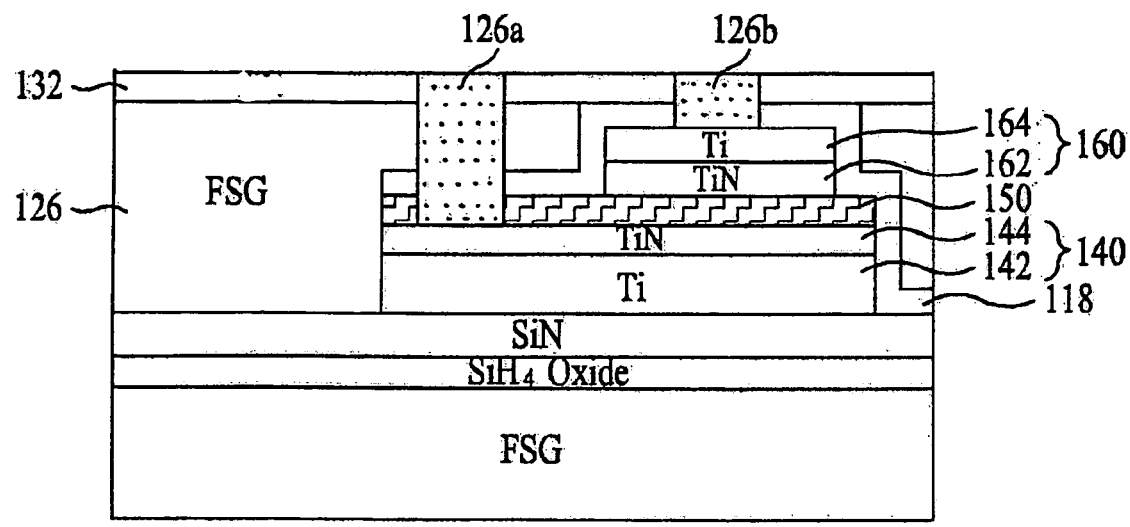

As illustrated in example FIG. 3D, an etching process using a first photoresist 190 as a mask may be performed to expose a partial region of the capacitor upper metal layer 160 and a partial region of the capacitor lower metal layer 140, in accordance with embodiments. Thereby, trenches 126a and 126b may be formed in the two exposed regions, respectively. The first trench 126a to expose the partial region of the capacitor lower metal layer 140 may be perforated through the capacitor dielectric layer 150, the second $SiH_4$ Oxide insulating layer 118, the FSG layer 126, and the third D-TEOS insulating layer 132. The second trench 126b to expose the capacitor upper metal layer 160 may be perforated through the second $SiH_4$ Oxide insulating layer 118, the FSG layer 126, and the third D-TEOS insulating layer 132. The first and second trenches 126a and 126b may be filled with metal such as Cu, to form the first and second contact layers 172 and 182 as shown in example FIG. 3E.

Figure 3F:
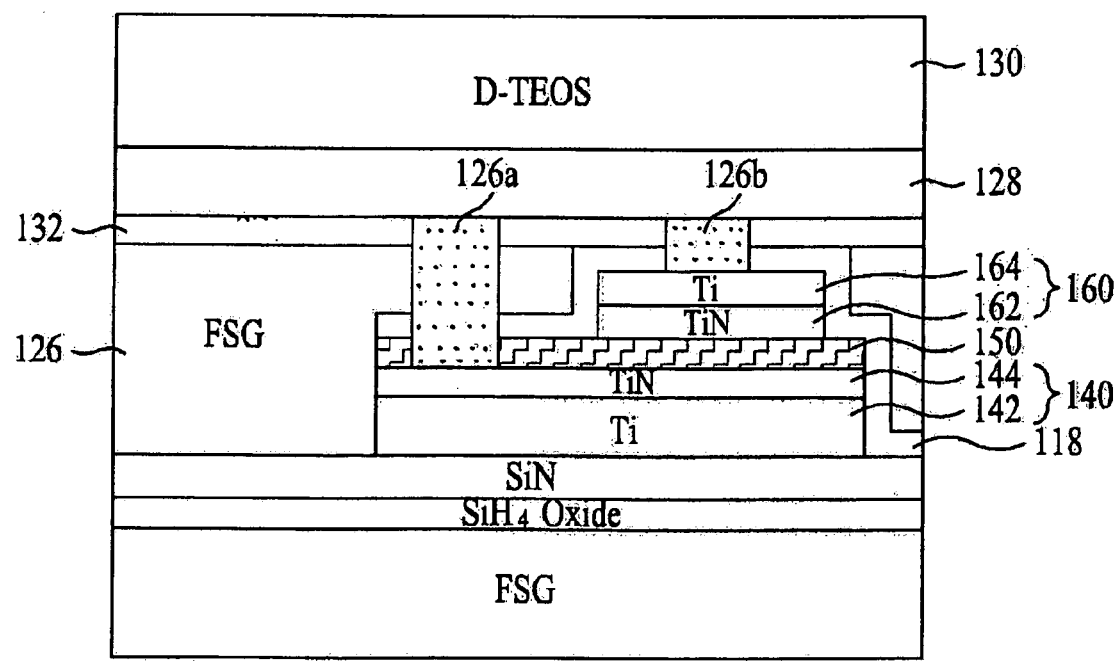
Figure 3G:
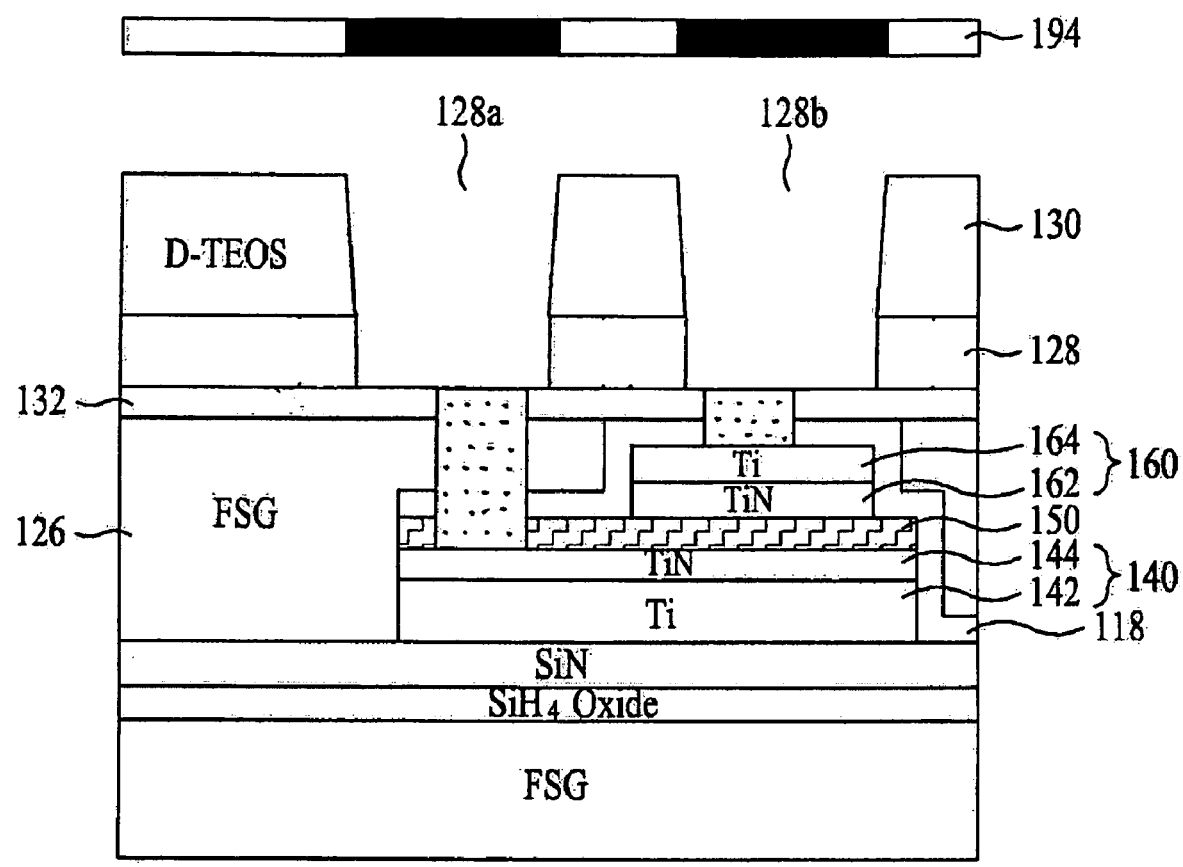

As shown in example FIG. 3F, the SiN layer 128 and the fourth D-TEOS insulating layer 130 may be sequentially formed over the entire surface of the semiconductor substrate 110. Next, as shown in example FIG. 3G, an etching process using a second photoresist 194 as a mask may be performed, to form trenches 128a and 128b above the capacitor lower metal layer 140 and above the capacitor upper metal layer 160, respectively.

Here, the third trench 128a may be perforated through the SiN layer 128 and the fourth D-TEOS insulating layer 130 over the capacitor lower metal layer 140. The fourth trench 128b may be perforated through the SiN layer 128 and the fourth D-TEOS insulating layer 130 over the capacitor upper metal layer 160.

Figure 3H:
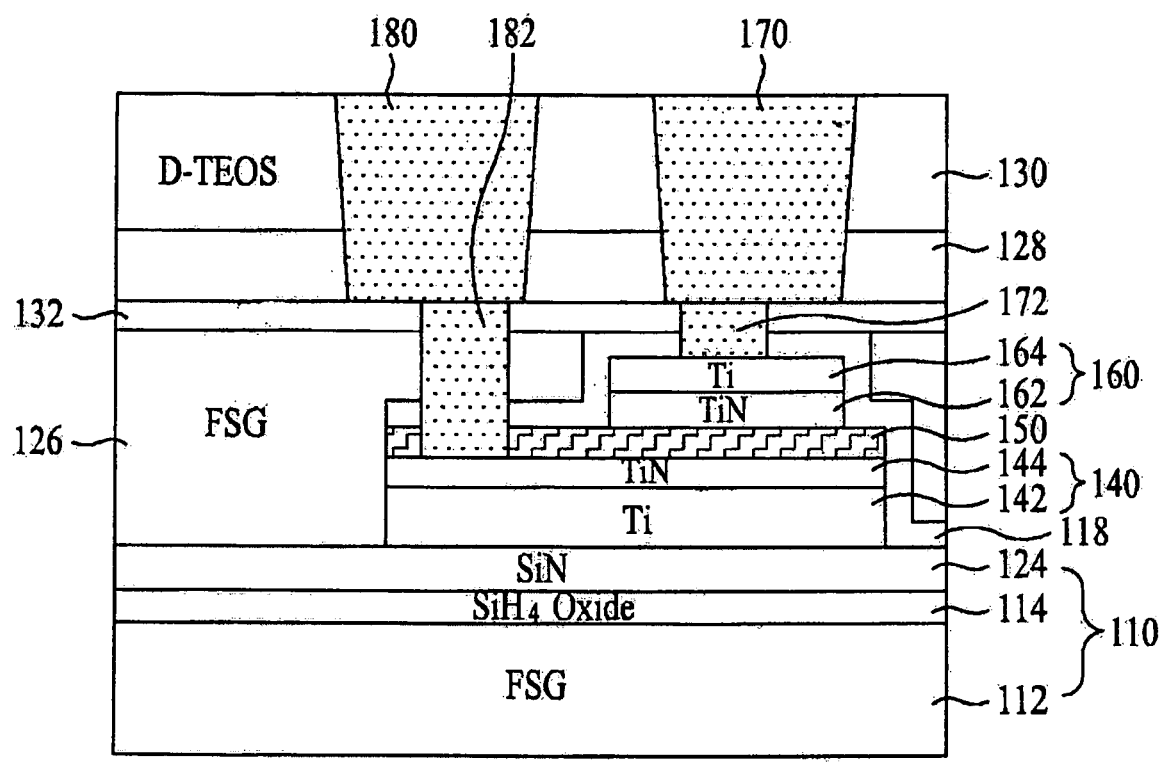

Thereafter, as shown in example FIG. 3H, the third and fourth trenches 128a and 128b may be filled with metal such as Cu, to form the first and second bonding metal layers 170 and 180 electrically connected to the first and second contact layers 172 and 182. Thereby, the capacitor upper metal layer 160 and the first bonding metal layer 170 may be electrically connected to each other with the first contact layer 172 interposed therebetween. The capacitor lower metal layer 140 and the second bonding metal layer 180 may be electrically connected to each other with the second contact layer 182 interposed therebetween.

With the method of fabricating the MIM capacitor semiconductor device according to embodiments, the SiN capacitor dielectric layer 150 of the MIM capacitor can be formed with a thickness of 30 nm or less without a lattice breakdown phenomenon. This can prevent current leakage due to lattice breakdown, resulting in an enhanced reliability in the device.

In addition, with the method of fabricating the MIM capacitor semiconductor device according to embodiments, the SiN capacitor dielectric layer 150 having a thickness of 30 nm or less can achieve a desired MIM capacitor capacitance of 2 $fF/cm^2$ to 4 $fF/cm^2$ or 4 $fF/cm^2$ or more without increasing an area of the device. Thereby, the degree of integration of the device can be improved and consequently, fabrication efficiency of the device can be improved.

As apparent from the above description, a semiconductor device according to embodiments has the effect of enhancing a capacitance of an MIM capacitor and maximizing the integration density of the device. Further, the semiconductor device can achieve excellent leakage voltage characteristics, assuring safety in the device.

In addition, with a method of fabricating the semiconductor device according to embodiments, a capacitor dielectric layer of the MIM capacitor can be formed to a thickness of 30 nm or less without a lattice breakdown phenomenon. This can prevent current leakage due to lattice breakdown, thereby achieving an enhancement in the reliability of the device.

Furthermore, in the method of fabricating the semiconductor device according to embodiments, with the formation of the capacitor dielectric layer having a thickness of 30 nm or less, the capacitance of the MIM capacitor can be enhanced up to 2 $fF/cm^2$ to 4 $fF/cm^2$ or 4 $fF/cm^2$ or more without increasing an area of the device. This has the effect of maximizing the integration density of the device, and consequently, maximizing fabrication efficiency of the device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
forming a capacitor lower metal layer over a semiconductor substrate including a plurality of layers;
forming a SiN layer over the capacitor lower metal layer;
reacting a surface of the SiN layer with a mixture of Ar gas and at least one of $NF_3$ and $NH_3$ gas via a remote plasma process to form a capacitor dielectric layer having a thickness of approximately 30 nm or less;
forming a capacitor upper metal layer over the capacitor dielectric layer;
forming a second insulating layer to cover a metal-insulator-metal capacitor region including the capacitor lower metal layer, the capacitor dielectric layer, and the capacitor upper metal layer;
forming an fluorine doped silicate glass layer, a third D-TEOS insulating layer, a SiN layer, and a fourth D-TEOS insulating layer sequentially over the entire surface of the semiconductor substrate;
forming a first contact layer by a conductive material and penetrating through the second and third insulating layers, to electrically connect the first bonding metal layer and the capacitor upper metal layer to each other;
forming a second contact layer by a conductive material and penetrating through the second and third insulating layers and the capacitor dielectric layer, to electrically connect the second bonding metal layer and the capacitor lower metal layer to each other,
wherein first and second bonding metal layers formed of conductive metals and penetrating through the fourth insulating layer and the SiN layer.

2. The method of claim 1, wherein the surface of the SiN layer is subjected to the remote plasma process using an RF power of approximately 100 W to 400 W.

3. The method of claim 2, wherein the surface of the SiN layer is subjected to the remote plasma process using a mixture of at least one of $NF_3$ and $NH_3$ gas at approximately 1,000 sccm to 3,000 sccm.

4. The method of claim 3, wherein the surface of the SiN layer is subjected to the remote plasma process using Ar gas at approximately 500 sccm to 3,000 sccm.

5. The method of claim 4, wherein the surface of the SiN layer is subjected to the remote plasma process using a pressure of approximately 4 Torr to 30 Torr.

6. The method of claim 1, wherein the semiconductor substrate includes at least one of a fluorine doped silicate glass layer, a $SiH_4$ oxide layer, and a SiN layer.

7. The method of claim 1, wherein each of the capacitor lower metal layer and the capacitor upper metal layer is formed of at least one Ti and one TiN layer.

8. The method of claim 7, wherein the Ti layer has a thickness of approximately 1,000 Å to 1,600 Å.

9. The method of claim 7, wherein the TiN layer has a thickness of approximately 200 Å to 800 Å.

10. An apparatus comprising:
a semiconductor substrate;
a capacitor lower metal layer formed over the semiconductor substrate;
a SiN capacitor dielectric layer having a thickness of approximately 30 nm or less formed over the capacitor lower metal layer;
a capacitor upper metal layer formed over a portion of the capacitor dielectric layer and overlapping with the capacitor lower metal layer;
a second insulating layer formed to cover a metal-insulator-metal capacitor region including the capacitor lower metal layer, the capacitor dielectric layer, and the capacitor upper metal layer; and
an fluorine doped silicate glass layer, a third D-TEOS insulating layer, a SiN layer, and a fourth D-TEOS insulating layer sequentially formed over the entire surface of the semiconductor substrate.

11. The apparatus of claim 10, wherein the capacitor dielectric layer is formed via a remote plasma reaction between a SiN layer surface and a mixture of $NF_3$ gas and argon gas.

12. The apparatus of claim 10, wherein the capacitor dielectric layer is formed via a remote plasma reaction between a SiN layer surface and a mixture of $NH_3$ gas and argon gas.

13. The apparatus of claim 10, wherein the semiconductor substrate includes at least one of a fluorine doped silicate glass layer, a first $SiH_4$ oxide insulating layer, and a SiN layer.

14. The apparatus of claim 10, wherein each of the capacitor lower metal layer and the capacitor upper metal layer is formed of at least one Ti and one TiN layer.

15. The apparatus of claim 14, wherein the Ti layer has a thickness of approximately 1,000 Å to 1,600 Å.

16. The apparatus of claim 14, wherein the TiN layer has a thickness of approximately 200 Å to 800 Å.

17. The apparatus of claim 10, comprising:
first and second bonding metal layers formed of conductive metals and penetrating through the fourth insulating layer and the SiN layer.

18. The apparatus of claim 17, comprising:
a first contact layer formed of a conductive material and penetrating through the second and third insulating layers, to electrically connect the first bonding metal layer and the capacitor upper metal layer to each other.

19. The apparatus of claim 18, comprising:
a second contact layer formed of a conductive material and penetrating through the second and third insulating layers and the capacitor dielectric layer, to electrically connect the second bonding metal layer and the capacitor lower metal layer to each other.

* * * * *